United States Patent [19]

Sueoka et al.

[11] Patent Number: 5,526,530
[45] Date of Patent: Jun. 11, 1996

[54] RECEIVER WITH SQUELCHING RESPONSIVE TO INPUT SIGNAL FREQUENCY

[75] Inventors: Toshiaki Sueoka, Tokyo; Bunichi Ohana, Kanagawa; Shoji Tsushimi, Kanagawa; Yoshihiro Murakami, Kanagawa, all of Japan

[73] Assignee: Sony Corporation, Tokyo, Japan

[21] Appl. No.: 493,784

[22] Filed: Jun. 22, 1995

Related U.S. Application Data

[63] Continuation of Ser. No. 144,395, Nov. 2, 1993, abandoned.

[30] Foreign Application Priority Data

Nov. 6, 1992 [JP] Japan .................................. 4-297110

[51] Int. Cl.$^6$ ...................................................... H04B 1/10
[52] U.S. Cl. ........................ 455/212; 455/218; 455/224; 375/351
[58] Field of Search ................................ 455/212, 213, 455/218, 219, 220, 221, 222, 223, 224, 296, 302, 303; 375/346, 349, 351

[56] References Cited

U.S. PATENT DOCUMENTS

| | | | |
|---|---|---|---|
| 4,718,115 | 1/1988 | Inoue | 455/218 |
| 4,969,207 | 11/1990 | Sakamoto et al. | 455/303 |
| 5,260,974 | 11/1993 | Johnson et al. | 455/222 |

Primary Examiner—Reinhard J. Eisenzopf
Assistant Examiner—Thanh Le
Attorney, Agent, or Firm—Jay H. Maioli

[57] ABSTRACT

In a receiver in which a squelch operation is switched on/off while comparing a reception level for an input frequency with a reference level, the reference level is set every input frequency in accordance with variation of reception sensitivity for the input frequency, which occurs at a front-end portion, and the on/off of the squelch operation is carried out while comparing the reception level with the re-set reference level. Since the reference level is reset every input frequency in accordance with variation of reception sensitivity for the input frequency, the on/off of the squelch operation is carried out at a beforehand set high frequency input level irrespective of the reception frequency.

1 Claim, 5 Drawing Sheets

5,526,530

RECEIVER WITH SQUELCHING RESPONSIVE TO INPUT SIGNAL FREQUENCY

This is a continuation of application Ser. No. 08/144,395, filed Nov. 2, 1993, now abandoned.

BACKGROUND OF THE INVENTION

1. Field of the Invention

This invention relates to a receiver and a space diversity receiver which are suitably applicable to a transmission and reception system of a wireless microphone used for news gathering for television and in a station studio.

2. Description of Related Art

A receiver of a transmission and reception system using a wireless microphone, which is used for television news gathering or in a station studio, is frequently used in such a condition that radio wave propagation is bad because it is used for television news gathering or in a station studio. In such a case, a diversity receiver, particularly a space diversity receiver has been more frequently used as a receiver for a wireless microphone. This is because the space diversity receiver can receive audio signals stably even if it is used under a relatively-bad radio wave propagation condition.

Therefore, for receivers (containing a space diversity receiver) which are used in the above case, at least the following two points are required to be achieved in function:

(1) for a single receiver (non-diversity receiver), the variation in reception sensitivity in accordance with an used frequency band is required to be depressed, and (2) for a space diversity receiver, even if there occurs dispersion in reception sensitivity between plural reception blocks which are used for diversity, it is required that no error occurs in selection of a reception block.

The condition (1) is based on the assumption that a squelch circuit is built in the receiver, and it is used to enable a squelch operation to be operated at the same input level at all times irrespective of an input frequency.

The condition (2) is required so that the reception block having the highest frequency input level of the plural reception blocks can be accurately selected at all times irrespective of an input frequency even if there is any dispersion in sensitivity between the reception blocks.

The condition (1) will be first described hereunder.

FIG. 1 shows a pass-band characteristic of a front-end portion comprising a high-frequency band-pass filter and a high-frequency amplifier in a receiver (which corresponds to each block if the receiver is a space diversity receiver, and a reception block A in this embodiment). The abscissa represents a frequency, and its unit is "MHz" while the ordinate represents a pass gain, and its unit is "dB".

In order to simplify the description, an extreme example is illustrated as the pass-band characteristic of this embodiment. When the reception frequency band ranges from 794 MHz to 810 MHz, the loss of a high-frequency input signal having the lowest center frequency (carrier frequency) f1=794 MHz of high-frequency input signals is smaller than a high-frequency input signal having center frequency f2=802 MHz by 1.5 dB. On the other hand, the loss of a high-frequency input signal having the highest center frequency f3=810 MHz is larger than the high-frequency input signal having center frequency f2=802 MHz by 1.0 dB.

Accordingly, it is apparent from the above fact that the high-frequency level output from the front-end portion is varied in accordance with the input frequency irrespective of input of the same level of high frequency (radio frequency) signals in the reception frequency band.

This means that a DC voltage obtained by detecting a high-frequency input level (hereinafter referred to as RSSI ("Receiving Signal Strength Indicator") voltage is varied in accordance with variation of the input frequency, so that the squelch operation level is dispersed. This is easily understood from FIG. 2. FIG. 2 is a graph showing a characteristic when the high-frequency input level is 15 dBµ, and the ordinate thereof represents an RSSI voltage whose unit is (V) while the abscissa thereof represents a frequency whose unit is (MHz).

The graph of FIG. 2 represents the case where the high-frequency input level, that is, a desired squelch operation level is set to 15 dBµ, and the RSSI voltage is equal to 1.80V for f1=794 MHz, 1.50V for f2=802 MH and 1.30V for f3=810 MHz. Accordingly, the RSSI voltage is varied in accordance with the frequency input level.

The condition (2) will be next described hereunder.

FIG. 3 is a graph showing variation of RSSI voltage in accordance with a reception input level for a pair of reception blocks (A) and (B) having the same construction.

The relationship between the high-frequency input level and the RSSI voltage in the reception blocks A and B are as follows due to constituent parts and dispersion in adjustment. That is, as shown in FIG. 7, the reception block A shows 1.25V for 10 dBµ, 2.25V for 30 dBµ and 4.70V for 80 dBµ, and the reception block B shows 1.45V for 10 dBµ, 2.45V for 35 dBµ and 4.75V for 80 dBµ.

As is apparent from the graph as shown in FIG. 3, dispersion occurs in slope of the RSSI voltage curve for the high-frequency input level below 35 dBµ. Therefore, it is apparent from this fact that a diversity switching operation cannot be accurately carried out for the high-frequency input level below 35 dBµ by merely comparing the RSSI voltages of the reception blocks A and B when there is any dispersion in reception sensitivity between the reception blocks.

As described above, if the above condition (1) is not satisfied, not only in the space diversity receiver, but also in a general receiver, the squelch operation is dispersed in accordance with the frequency. In other words, this means that a reach distance (usable distance) between a wireless microphone and a receiver is varied in accordance with an used frequency band when the wireless wire is used for news gathering for television. The variation of the reach distance confuses a user.

With respect to the condition (2), the function of selecting a reception block having higher reception input level, which is inherent to the space diversity receiver, cannot be obtained.

SUMMARY OF THE INVENTION

An object of this invention is to provide a receiver and a space diversity receiver in which dispersion of squelch operation in accordance with variation of frequency is depressed and an inherent space diversity function can be achieved.

In order to attain the above object, according to a first aspect of this invention, a receiver for carrying out an on/off of a squelch operation through comparison between a reception level for an input frequency and a reference level is characterized in that the reference level is set every input frequency in accordance with variation in reception sensitivity for the input frequency occurring in a front-end portion, and the on/off of the squelch operation is carried out while comparing the re-set reference level and the reception level.

According to anther aspect of this invention, a space diversity receiver which has at least two reception blocks and selects one of the reception blocks to be used on the basis of the comparison in magnitude of reception level when the same input frequency is received is characterized in that the reception level for the input frequency is used as a reference level for selecting the reception block, and the reference level for each reception block is set in accordance with variation in reception sensitivity for the same input frequency, which occurs due to dispersion in characteristic of the front-end portion or the like, thereby performing the selection of the reception block on the basis of the re-set reference level.

DETAILED DESCRIPTION OF THE PREFERRED EMBODIMENTS

Preferred embodiments of a receiver and a space diversity receiver according to this invention will be described in detail with reference to the accompanying drawings. The following embodiment relates to a space diversity receiver having a squelch function. Only the squelch function according to this invention is applicable to a non-diversity receiver, however, both of the diversity function and the squelch function are applicable to a space diversity receiver.

Figure 4:
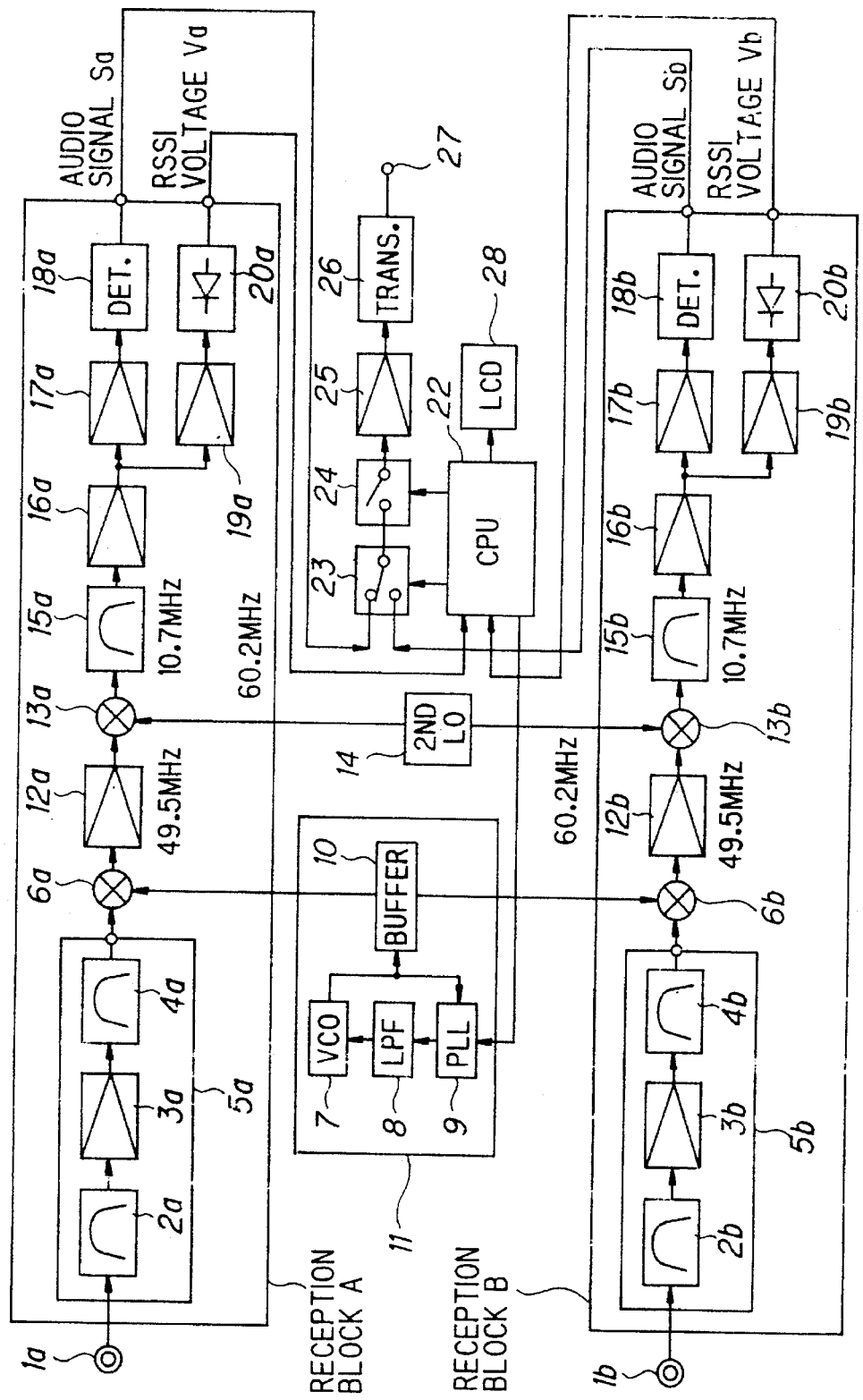
FIG. 4 is a systematical diagram showing an embodiment of a space diversity receiver according to this invention.

FIG. 4 shows a space diversity receiver equipped with two reception blocks A and B. As well known, the reception blocks A and B have the same construction, and thus the construction and operation of only the reception block A will be described. Characters "a" and "b" are affixed to the reception blocks A and B, respectively.

A high-frequency signal which is input from an antenna terminal 1a is passed through a band-pass filter 2a, amplified in a high-frequency amplifier 3a, and then passed through another band-pass filter 4a at a rear stage. These elements constitute a front-end portion 5a.

The high-frequency signal output from the front-end portion 5a is input to a first mixer 6a to be mixed with a high-frequency output signal from a first oscillation unit 11 comprising a VCO (voltage controlled oscillator) 7, a low-pass filter 8, a PLL 9, and a high-frequency buffer amplifier 10. A difference between these signals is obtained to output a first intermediate frequency signal from the mixer 6a. The first oscillation unit 11 is commonly used for the reception blocks A and B.

The first mixer 6a carries out a frequency conversion processing as is well known. Assuming the frequency of the high-frequency input signal to be 802.00 MHz, the output signal frequency of the first oscillation portion 11 is equal to 851.50 MHz as shown in the following equation (1) by setting the first intermediate frequency to 49.5 MHz and calculating the difference between these frequencies:

$$851.50 - 802.00 = 49.5 \ Mhz \tag{1}$$

The first intermediate frequency signal is amplified in the first intermediate frequency amplifier 12a, and then input to a second mixer 13a. In the second mixer 13a, both of the first intermediate frequency signal and the output signal of the second oscillation portion 14 are mixed in the same operation principle as the first mixer 6a, and the second intermediate frequency signal is obtained from the difference therebetween.

In this case, the output signal of the second mixer 13a is equal to 60.2 MHz for the first intermediate frequency signal of 49.5 MHz, and thus the second intermediate frequency is equal to 10.7 MHz as shown in the following equation (2):

$$60.2 - 49.5 = 10.7 \ MHz \tag{2}$$

The second intermediate frequency signal is passed through a band-pass filter 15a, and then amplified in a second intermediate frequency amplifier 16a to obtain a selectivity characteristic. The amplified second intermediate frequency signal is branched into two signals, one signal being supplied to a demodulation system for audio signals, and the other signal being supplied to a system for obtaining an RSSI voltage.

In the system for the RSSI voltage, the second intermediate frequency signal level is amplified by the amplifier 19a, and then rectified by a diode rectifier 20a to thereby obtain a DC voltage (RSSI voltage). The rectified RSSI voltage Va is input to an analog board of a CPU 22 which is common to the reception blocks A and B. The CPU 22 makes a judgment on the squelch operation by comparing the RSSI voltage Va with a reference value which is introduced in accordance with a relational expression of an initial set value.

In the system for obtaining the audio signal Sa, an AM component is removed from the second intermediate frequency signal by a high-gain limiter amplifier 17a to leave only a frequency component in the second intermediate frequency signal, and demodulated into an audio signal by a detector 18a.

The diversity receiver is equipped with another reception block B having the same construction as the reception block A, and an audio signal Sb and an RSSI voltage Vb are also output from the reception block B. The demodulated audio signals Sa and Sb are input to a diversity change-over switch 23. In the CPU 22, both of the RSSI voltages Va and Vb are compared with the reference value which is beforehand initialized in accordance with a parameter, and selection of the audio signal Sa or Sb from the reception block A or B which is stronger in high-frequency input level is carried out by the switch 23.

The audio signal which is selected by the diversity change-over switch 23 is input to the squelch switch 24. It is judged by the CPU 22 whether the squelch operation should be carried out. The audio signal is interrupted when the squelch operation is set to be on in response to a control signal of the CPU 22, and it is directly output when the squelch operation is set to be off in response to the control signal.

When the squelch switch 24 is switched to a conductive state, the audio signal is input to an audio amplifier 25, and it is converted from an unbalanced input to a balanced input by an output transformer. The audio signal which is converted to the balanced output is supplied through an audio output terminal 27 to a speaker (not shown).

As described above, the squelch operation and the selection of the reception block are carried out in the CPU 22, and these operations will be next described.

Figure 1:
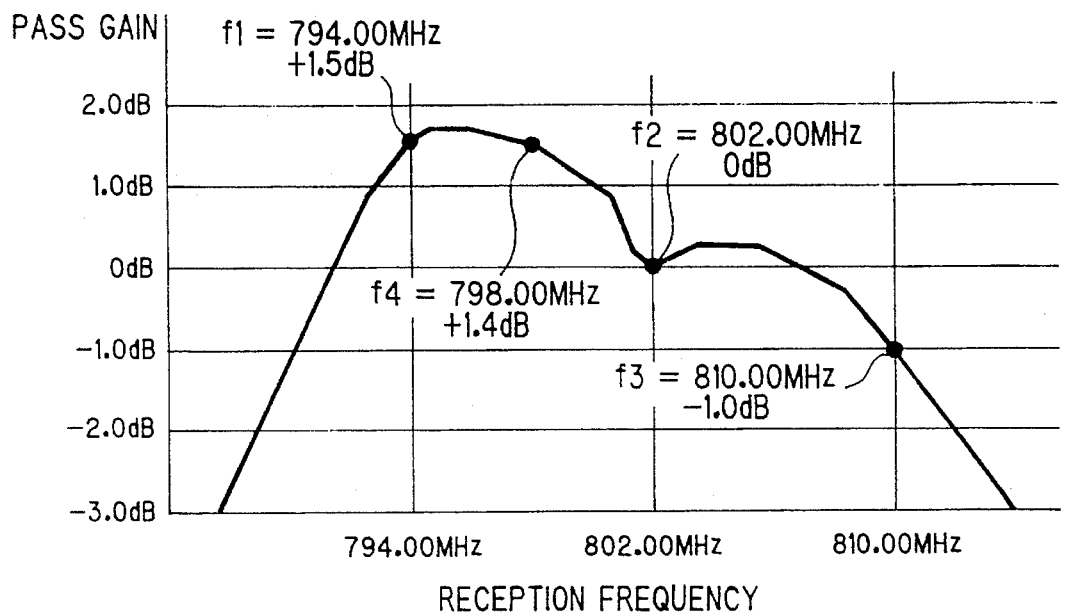
FIG. 1 is a characteristic graph showing the relationship between a reception frequency and a pass-band characteristic.

The squelch operation will be first described. It was previously described that, as shown in FIG. 1, the level of the high-frequency input signal output from the front-end portion 5a is varied in accordance with its frequency band, and if it is not modified, the RSSI voltage would be varied in accordance with the reception frequency band even for the same high-frequency input level as shown in FIG. 2.

Figure 2:
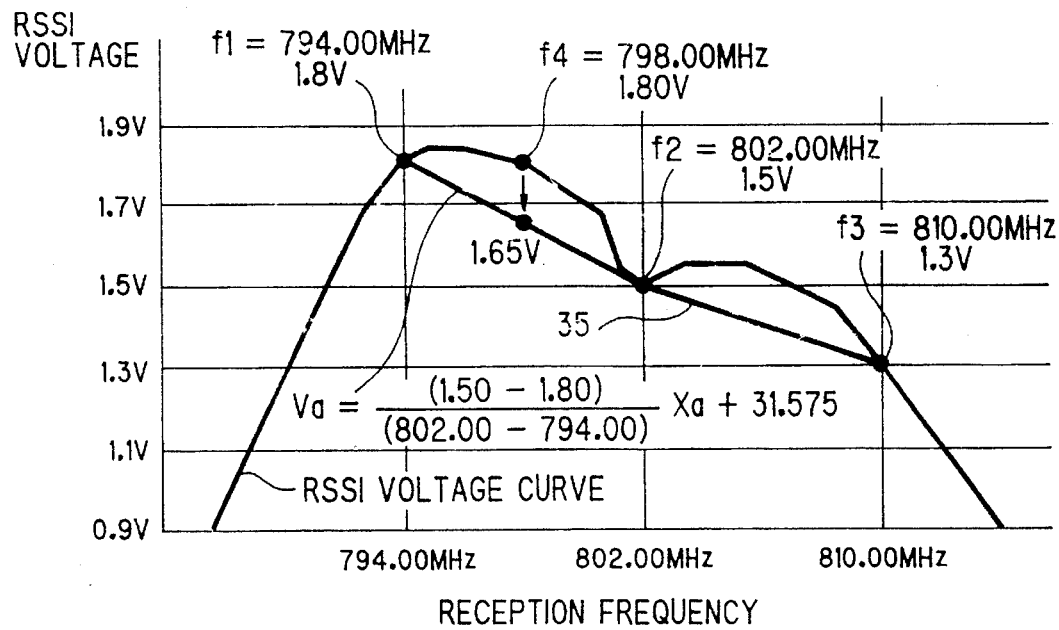
FIG. 2 is a characteristic graph showing the relationship between an RSSI voltage and a reception frequency.

Accordingly, as shown by a correction curve 35 of FIG. 2, the RSSI voltage values obtained at special reception frequencies are directly used as a reference voltage. In the example of FIG. 2, 794.00 MHz, 802.00 MHz and 810.00 MHz are selected as the special reception frequencies. With respect to the RSSI voltages obtained at the reception frequencies other than the special reception frequencies as described above, these RSSI voltages are not directly used, but those voltages which are obtained by interpolating these RSSI voltages are used as reference voltages.

For example, for the squelch operation when the reception frequency is 794 MHz, the reference voltage (comparative reference voltage) may be set to 1.80V for the RSSI voltage. If the RSSI voltage is decreased below 1.80V, the squelch operation would start and the audio signal would be interrupted.

Likewise, for the reception frequency of 802 MHz, 1.50V is used as the reference voltage, and 1.30V is used as the reference voltage for the reception frequency of 810 MHz.

These reference voltages are used at the special reception frequencies, however, the following value Ya obtained in accordance with the following interpolative equation is used as a reference voltage for any input frequency between 794 MHz and 802 MHz:

$$Ya=\{(1.50-1.80)/(802.00-794.00)\}Xa+31.575 \quad (3)$$

Here, Xa represents an input frequency.

For example, for 798.00 MHz which is an intermediate frequency between 794.00 MHz and 802.00 MHz, the reference voltage Ya is equal to 1.6V because Xa is equal to 798 MHz. As a result, the reference voltage for the squelch operation level at the reception frequency of 798.00 MHz is equal to 1.65V.

Using this interpolative correction, even if the characteristic of the front-end portion 5a is dispersed in accordance with the reception frequency, the on/off of the squelch operation can be controlled with the same set high-frequency level as a reference level at all times.

In a case where no correction is made for lower and higher reception frequencies in a reception frequency band, the squelch operation level is varied by 0.45V at maximum. On the other hand, if the reference voltage in accordance with the reception frequency characteristic is used, the dispersion of the squelch operation level can be suppressed within a narrow range of 0.15V. By increasing the number of special frequencies used to obtain the RSSI voltages to thereby increase the number of points for initial set values for the interpolation, interpolation precision is improved by the increased amount, and the dispersion of the squelch operation level can be more suppressed.

Next, the correction of dispersion between the reception blocks will be described.

Figure 3:
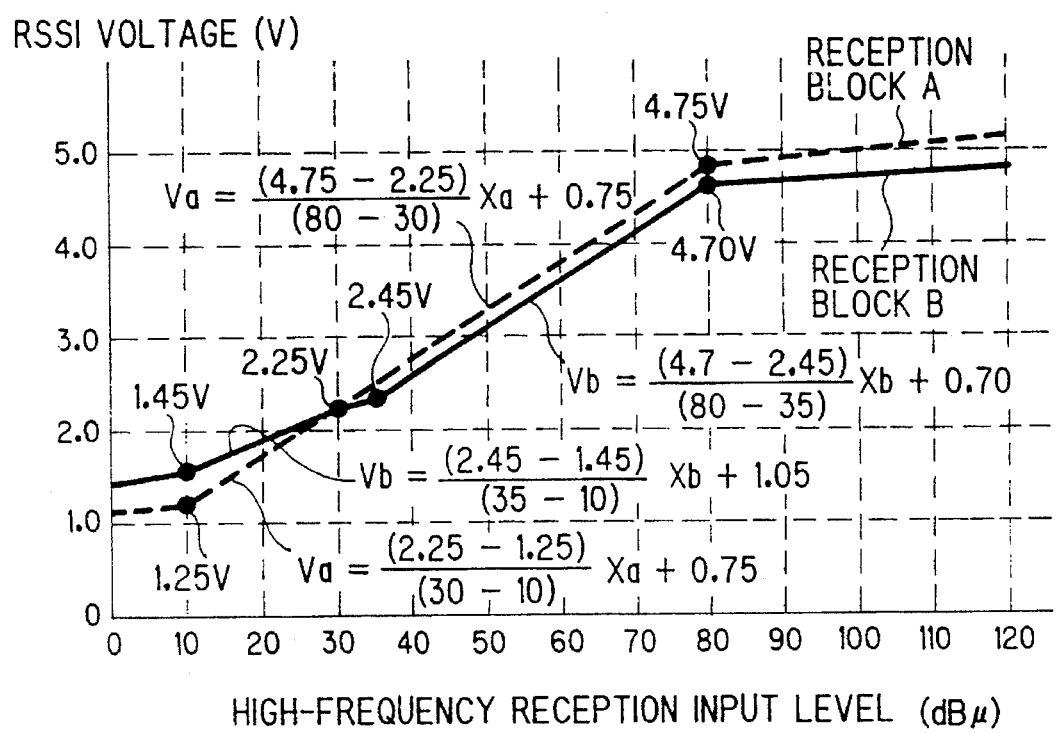
FIG. 3 is a characteristic graph showing the relationship between a high-frequency input level and an RSSI voltage.

It was previously described that the RSSI voltage for the reception input level in the reception blocks A and B was varied as shown in FIG. 3 due to the parts constituting each block and dispersion of adjustment to these parts. As is apparent from the graph of FIG. 3, the slope of the RSSI voltage curve is dispersed for the high-frequency input level below 35 dBµ.

Accordingly, for the reception blocks A and B, the high-frequency input levels Xa and Xb at the detected RSSI voltages Va and Vb are calculated in accordance with the following correction equations.

For the reception block A, (1) for the high-frequency input level in the range of 10 to 30 dBµ, $$Va=\{(2.25-1.25)/(30-10)\}Xa+0.75 \quad (4)$$

(2) for the high-frequency input level in the range of 30 to 80 dBµ, $$Va=(4.75-2.25)/(80-30)Xa+0.75 \quad (5)$$

(3) for the high-frequency input level in the range of 10 to 35 dBµ, $$Vb=(2.45-1.45)/(35-10)Xb+1.05 \quad (6)$$

(4) for the high-frequency input level in the range of 35 to 80 dBµ, $$Vb=(4.70-2.45)/(80-35)Xb+0.70 \quad (7)$$

On the basis of the equations (4), (5), (6) and (7), the high-frequency reception input levels Xa and Xb are calculated from the RSSI voltages Va and Vb respectively, so that the judgment on selection of one of the reception blocks A and B can be made.

For example, it is assumed that the RSSI voltage Va of the reception block A is equal to 1.65V and the RSSI voltage Vb of the reception block B is equal to 1.80V. If a simple comparison is made between these RSSI voltages, it is better to select the reception block B. However, in this case, the high-frequency input levels Xa and Xb are inversely calculated from the RSSI voltages.

For the RSSI voltage Va of 1.65V, the high-frequency input level Xa is equal to 18.0 dBµ in accordance with the equation (4), and this is apparent from the curve of FIG. 3. Further, for the RSSI voltage Vb of 1.80V, the high-frequency input level Xb is equal to 15.0 dBµ in accordance with the equation (6), and this is also apparent from the curve of FIG. 3.

As is apparent from the comparison between these RSSI voltages of the reception blocks A and B, the high-frequency input level of the reception block A is higher than that of the reception block B, and thus the reception block A is selected. This operation is suitably selected in accordance with each high-frequency input level, and executed. Therefore, as shown in FIG. 3, the RSSI voltage at a point of inflection is memorized and (7) is calculated from the equation (4).

Figure 5:
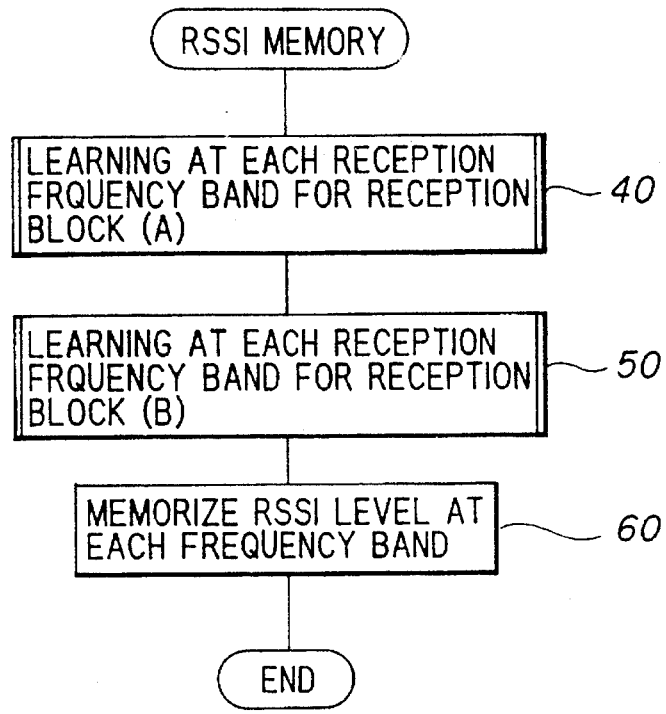
FIG. 5 is a control flowchart for an initializing operation to control a squelch operation and a diversity control operation.
Figure 6:
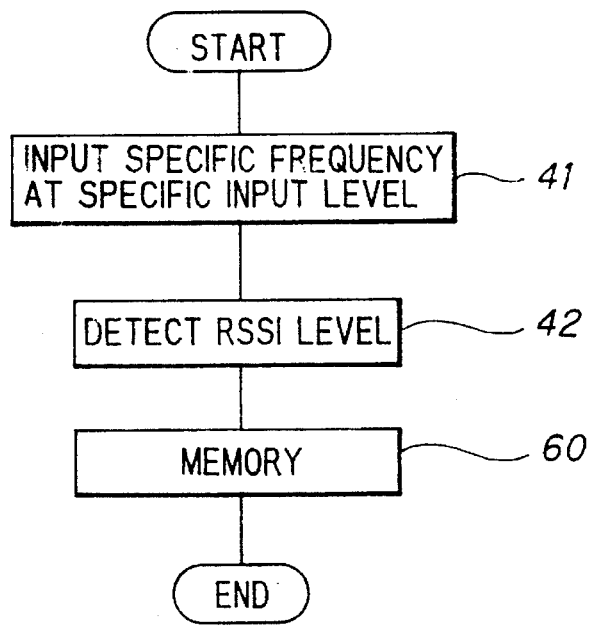
FIG. 6 is another control flowchart for the initializing operation to control the squelch operation and the diversity control operation.
Figure 7:
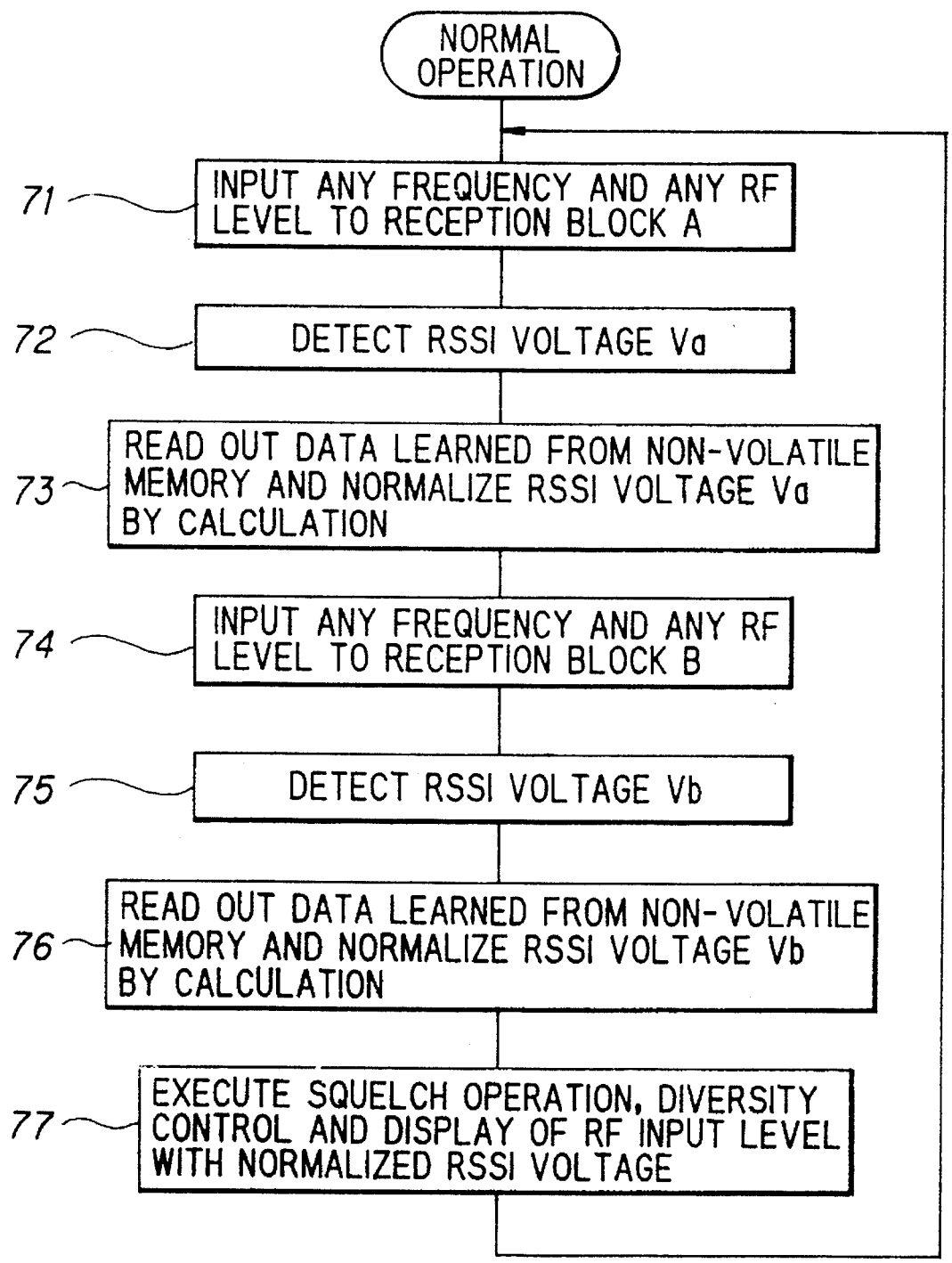
FIG. 7 is a flowchart for an example of the squelch operation and the diversity control in operation of a receiver.

Accordingly, the CPU 22 contains control programs as shown in FIGS. 5 to 7 to perform the above operation, and the operation is suitably controlled on the basis of an instruction of the CPU 22.

FIG. 5 is a flowchart for a memory processing operation of the RSSI voltage in which a learning at a special reception frequency band for the reception block A is carried out, and the learning result is memorized (steps 40 and 60). Specifically, this program is a control program as shown in FIG. 6. Through this control program, a specific frequency at a specific input level in consideration of the graphs of FIGS. 2 and 3 is input, and the RSSI voltage at this time is memorized in a RAM or ROM (steps 41, 42 and 60).

In this embodiment, the specific input levels correspond to 10, 30, 35 and 80 dBμ, and the RSSI voltages at these specific input levels are memorized. Further, the specific input frequency corresponds to 794.00, 802.00 and 810.00 MHz, and the RSSI voltages at these input frequencies are memorized.

Likewise, a learning at a specific reception frequency band (containing a specific input level) for the reception block B is carried out using the manner as shown in FIG. 6, and the RSSI voltage which is a learning result is memorized (steps 50 and 60).

FIG. 7 is a flowchart for the control operation during a receiving operation. For the reception block A, the RSSI voltage Va for an input high-frequency input signal having any frequency and level is detected, and then is subjected to the interpolation in accordance with the interpolation equation as described above (steps 71, 72 and 73).

In a case where the input frequency is the specific frequency as described above, the RSSI voltage at this time is used as the reference voltage without being interpolated, and in other cases, the reference voltage is calculated in accordance with the interpolation equation as described above. When the high-frequency input level is inversely calculated, the interpolated RSSI voltage is likewise used.

The same interpolation processing is carried out for the reception block B, and the squelch operation and the diversity control are carried out on the basis of the voltage which is normalized by the interpolation (steps 74, 75, 76 and 77). The normalized high-frequency input level may be displayed using a display means 28 (see FIG. 4) such as a LCD (liquid crystal display).

In the embodiment as described above, the squelch operation and the diversity control are carried out using the RSSI voltage, however, they may be carried out using a DC voltage which is obtained by detecting a noise portion of an audio signal.

In consideration of user's convenience, the level of the squelch operation may be designed so that one of four stages of 30 dBμ, 20 dBμ, 10 dBμ and squelch-release can be suitably selected as the level of the squelch operation. The squelch operation may be displayed on the display means 28 together with the received input high-frequency level. In this case, the display level and the actual high-frequency input level for the operation are completely coincident with each other.

Variation of the squelch operation and the diversity control with temperature was not described above. However, it is easily understood to produce a better result by carrying out the squelch operation and the diversity control in consideration of temperature.

When exchange of parts is carried out for maintenance, it is better to carry out the initialization of the RSSI voltages again. This is to suppress dispersion of the squelch operation and the diversity control due to the exchange of the parts.

As described above, in this invention, the detected voltage is corrected so as to be usable as a signal for the squelch operation or diversity control. According to this invention, the following effects can be obtained:

(1) the dispersion of the squelch operation level due to variation of the frequency within the reception band can be depressed, (2) in the space diversity receiver, the malfunction of the diversity switching operation due to variation of the reception frequency and the high-frequency input level can be overcome, and (3) since a space diversity receiver in which at least one antenna is commonly used for plural receivers and these plural receivers are used at the same time is used, the dispersion of the diversity control due to dispersion of the reception blocks can be suppressed.

What is claimed is:

1. A signal receiving apparatus for a high-frequency signal, comprising:

processing means including a filter having a known passband characteristic receiving the high-frequency signal from an antenna terminal and outputting a filtered signal to an amplifier for amplifying the filtered signal and producing a processed signal;

level detecting means connected to the processing means for detecting a level of the processed signal and producing a level signal;

squelching means connected to receive the processed signal for squelching the processed signal; and controlling means for controlling said squelching means, said controlling means including:

reference voltage generating means for generating interpolated reference voltages for a plurality of different frequencies in the passband characteristic of said filter by interpolating a plurality of level signals detected by the level detecting means in the passband characteristic of the filter, and comparing means for comparing the level signal and the interpolated reference voltage at the respective frequency and producing a comparison signal, whereby said controlling means controls the squelching means in response to the comparison signal.

* * * * *